United States Patent [19]

Aketagawa et al.

[11] Patent Number: 5,441,012
[45] Date of Patent: Aug. 15, 1995

[54] THIN FILM DEPOSITION METHOD FOR WAFER

[75] Inventors: Ken-ichi Aketagawa; Junro Sakai, both of Fuchu; Toru Tatsumi, Tokyo, all of Japan

[73] Assignees: ANELVA Corporation; NEC Corporation, both of Tokyo, Japan

[21] Appl. No.: 186,502

[22] Filed: Jan. 26, 1994

Related U.S. Application Data

[63] Continuation of Ser. No. 763,146, Sep. 20, 1991, abandoned.

[30] Foreign Application Priority Data

Sep. 21, 1990 [JP] Japan .................................. 2-253004

[51] Int. Cl.$^6$ ............................................. C30B 25/14
[52] U.S. Cl. ....................................... 117/86; 117/89; 117/93; 117/103; 117/935
[58] Field of Search ........................ 117/89, 93, 85, 86, 117/125, 935; 437/89, 106

[56] References Cited

U.S. PATENT DOCUMENTS

| | | | |
|---|---|---|---|
| 3,717,514 | 2/1973 | Burgess | 437/89 |
| 4,462,847 | 7/1984 | Thompson et al. | 156/613 |
| 4,497,683 | 2/1985 | Celler et al. | 156/613 |
| 4,834,831 | 5/1989 | Nishizawa et al. | 156/610 |
| 4,910,165 | 3/1990 | Lee et al. | 156/613 |
| 4,963,506 | 10/1990 | Liaw et al. | 437/108 |

FOREIGN PATENT DOCUMENTS

| | | | |
|---|---|---|---|
| 244081 | 11/1987 | European Pat. Off. | 156/DIG. 64 |
| 02106922 | 4/1990 | Japan | 156/DIG. 64 |
| 1358438 | 7/1974 | United Kingdom | 156/610 |

*Primary Examiner*—Robert Kunemund
*Attorney, Agent, or Firm*—Wenderoth, Lind & Ponack

[57] ABSTRACT

A thin film deposition method consists of placing a wafer or substrate whose surface contains at least two kinds of materials inside a vacuum chamber or vessel, supplying a reactant gas into the vacuum chamber or vessel, the reactant gas containing molecules having a low sticking coefficient relative to at least one of the at least two kinds of materials, and allowing an epitaxial growth to occur on the other kinds of materials contained in the wafer or substrate.

The method further includes setting the pressure inside the vacuum chamber or vessel filled with the reactant gas equal to a pressure range in which the mean free path (d) of the reactant gas molecules is longer than the shortest distance (L) between the wafer or substrate placed inside the vacuum chamber or vessel and the vacuum side-exposed wall of the vacuum chamber or vessel, i.e., $d > L$.

The method further includes stopping the introduction of the reactant gas into the vacuum chamber or vessel until the total amount of the reactant gas introduced into the vacuum chamber or vessel reaches its level at which a thin film can be created onto the surface containing the kind of material having the low sticking coefficient relative to the reactant gas, or more specifically, stopping the introduction of the reactant gas until the total amount of the reactant gas molecules striking against the wafer or substrate reaches its level at which a thin film can be created onto the surface containing the kind of material having the low sticking coefficient.

13 Claims, 10 Drawing Sheets

$\theta = 110.2°$

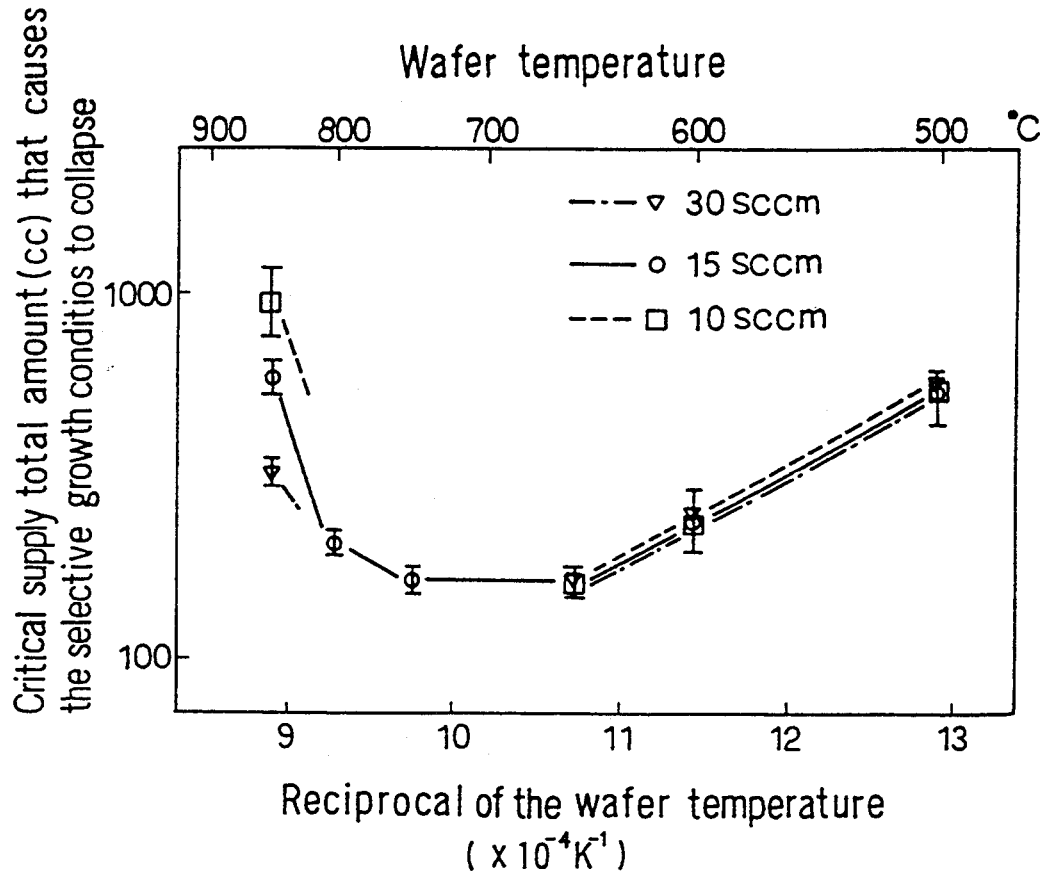

THIN FILM DEPOSITION METHOD FOR WAFER

This application is a continuation of now abandoned application, Ser. No. 07/763,146, filed Sep. 20, 1991, now abandoned.

BACKGROUND OF THE INVENTION

1. Field of the Invention

The present invention relates generally to a thin film deposition method for a wafer, and particularly to a method for selectively growing a thin film on a wafer patterned by using a material having a low sticking coefficient relative to molecules in a reactant gas. And more particularly, the present invention relates to a selective epitaxial growth in which a predetermined thin film is only deposited onto the openings formed on the patterned wafer.

2. Description of the Prior Art

There are several conventional methods that consist of the selective epitaxial growth process using the reactant gas, including:

(1) a method including a selective etching process in which the film formed onto a patterned wafer (a thin film is formed in a some kind of pattern on a wafer on the processor the manufacture of semiconductor devices that involves some processes such as the oxidation process, the diffusion process, the resist coating process, the etching process, the thin film deposition process, etc.), is selectively removed, and consequently the epitaxial growth film is only deposited onto the openings on the patterned wafer;

(2) a method in which a thin film is deposited by decreasing the flow rate of the reactant gas to be supplied; and (3) the method in which a thin film is deposited by dropping the temperature of a wafer.

One of the methods listed above, i.e., the method (1), requires that the temperature of a wafer should be raised to a higher temperature during the selective etching process.

For example, when a silicon (Si) film is selectively grown on a silicon (Si) substrate, a reactant gas that is mixed with some gases (such as $SiCl_2H_2$ or $HCL+SiH_4$) is used so that the selective etching process can proceed for the Si film. That is, according to the method (1), the Si film is grown on the Si substrate while the etching process is going on for the polycrystalline silicon film being formed on the oxide layer. The etching process for the polycrystalline silicon film according to that method can only proceed when the temperature of the Si substrate is higher.

Yew et al. (J. Appl. Phys. 65 (6), 15 Mar. 1989, pp. 2500-2507, "Selective silicon epitaxial growth at 800° C. by ultralow-pressure chemical vapor deposition using $SiH_4$ and $SiH_4/H_2$") reports that the required temperature of a wafer is about 800° C.

For this reason, the structure formed by the thermal diffusion process within a wafer might be destroyed at the high temperature.

The method (3) in which the temperature of the wafer is dropped is reported by Hirayama et al. (Appl. Phys. Lett. 52 (26), 27 Jun. 1988, pp. 2242-2243, "Selective growth condition in dislane gas source silicon molecular beam epitaxy"). This research report says that in order to accomplish the selective growth by dropping the temperature of the wafer, it is necessary to limit the flow rate of the reactant gas. In this case, however, the high-speed selective growth is practically impossible, and it can not be applied to the manufacture of the semiconductor devices.

SUMMARY OF THE INVENTION

In light of the problems that have been described above with reference to the prior are methods, the object of the present invention is to provide a thin film deposition method by which the temperature of a wafer or substrate being processed can be set to a lower temperature and maintained at such temperature, and a high-speed, selective epitaxial growth can be achieved.

In order to accomplish the above object, the present invention consists essentially of previously patterning by forming a thin film of a material having a lower sticking coefficient compared with that of a substrate in relation to a reactant gas being supplied on the surface of the substrate, and depositing a thin film on the thus formed substrate according to the following requirements:

(i) to maintain the pressure within the vacuum chamber or vessel within a lower pressure range in which the reactant gas will cause substantially no vapor phase reaction, and (ii) to maintain the surface molecular concentration of the reactant gas upon a thin film made of the material with the lower sticking coefficient below the one which would cause a nucleus formation.

Practically, it is not easy to perceive the surface molecular concentration on the material with the lower sticking coefficient. Despite this, the inventors of the present application have discovered that whether the nucleus formation occurs or not may be determined by the total amount of the reactant gas being supplied. According to the present invention, the second requirement that specifies "to maintain the surface molecular concentration of the reactant gas upon the thin film made of the material with the lower sticking coefficient below the one which would cause a nucleus formation" is replaced by the requirement that specifies "to maintain the total amount of the reactant gas being supplied below the one that would cause the nucleus formation on a thin film made of material with the lower sticking coefficient", and the method according to the present invention can be satisfied with the latter requirement.

The total amont of the reactant gas to t,e supplied can only be controlled effectively under particular conditions. Those conditions may include the parameters such as the profile of the gas nozzle orifice in the thin film deposition arrangement, the distance between the gas nozzle orifice and the wafer, the size of the vacuum chamber or vessel, etc. If some of those conditions change, the total amount of the reactant gas, which may be supplied until the nucleus formation occurs on the thin film having lower sticking coefficient and the selective epitaxia growth collapses, will be changed.

Then, the requirement that specifies "to maintain the surface molecular concentration of the reactant gas upon a thin film made of the material with the lower sticking coefficient below the one that would cause the nucleus formation" may be replaced by the requirement that specifies "to maintain the total number of those molecules in the reactant gas impinging onto the wafer below the one that would cause the nucleus formation upon a thin film of the material with the lower sticking coefficient (i.e., the number of those molecules impinging onto the wafer)". The latter requirement may be the universal requirement. If the total number of those molecules in the reactant gas impinging onto the wafer can be satisfied with this universal requirement, the selective epitaxial growth can proceed, regardless of any change in the above physical parameters for the thin film deposition hardware arrangement, such as the profile of the gas nozzle orifice, the distance between the gas nozzle orifice and the water, the size of vacuum chamber or vessel, etc.

The term "the pressure range" in the first requirement that will cause substantially no vapor phase reaction which is referred to herein, means the pressure range within which the probability that the reactant gas molecules will strike against the inner wall of the vacuum chamber (the vacuum-side exposed wall) or the wafer before they collide with each other within the vacuum chamber can be increased considerably. In this pressure range, the probability that the molecules will strike against the inner wall or wafer is by far greater than the probability that the molecules will collide with each other, so that the probability that the molecules will exchange heat therebetween becomes smaller. This means that most of the molecules can only exchange heat with the inner wall or wafer. In other words, the smaller probability of the molecules exchanging heat therebetween means that little thermal conduction ocuurs between the molecules in their vapor phase. Under those conditions, it is possible that the molecules may receive some thermal energy that would cause the thermally decomposing reaction (pyrosis), but in the total vapor phase, the thermally decomposing reaction (pyrosis) will not occur because of the small thermal conduction in the vapor phase. Substantially no vapor phase reaction will occur across the space within the vacuum chamber. Then, if the temperature of the inner wall of the vacuum chamber is set to such a temperature as to prevent the reactant gas molecules from generating the thermally decomposing reaction (pyrosis), the reactant gas can only cause the thermally decomposing reaction (pyrosis) on the surface of the wafer. Thus, a thin film can only be deposited on the surface of the wafer under the thermally decomposing reaction (pyrosis) of the reactant gas.

In order to provide the pressure range that will cause substantially no vapor phase reaction, the optimal way is to set the pressure within the vacuum chamber in such a way that the mean free path along which the reactant gas molecules can travel is longer than the shortest distance between the wafer and the inner wall of the vacuum chamber. That is, the following equation should be satisfied.

$$d > L \qquad (1)$$

where d is the mean free path of the reactant gas molecules, and L is the shortest distance between the wafer and inner wall. Setting the condition as specified by the equation (1) can eliminate the thermally decomposing reaction (pyrosis) that might otherwise be caused by the reactant gas in the vapor phase. When the equation (1) is satisfied, the mean free path for the molecules is longer than the shortest distance between the wafer and inner wall. Under this condition, even if the molecules may receive heat upon striking against the wafer, and may be ejected from the wafer, the thermally decomposing reaction (pyrosis) doesn't occur in the vapor phase. Because there is less probability that those molecules will collide with each other whereas there is more probability that they will strike against the inner wall and the wafer.

Another way is to set the distance between the gas nozzle and the wafer to be smaller khan the mean free path of the reactant gas molecules. In this way, the reactant gas molecules can also be prevented from colliding with each other while traveling across the space in the vacuum chamber. Setting the distance between the gas nozzle and the wafer in this way increases the probability that the reactant gas molecules supplied from the gas nozzle (primary molecules) can reach the wafer directly without colliding with each other on the way.

What should be considered here is exclusively the probability that those molecules which have been given the themal energy that might cause the potential thermally decomposing reaction (pyrosys) could collide with each. Therefore, it is not necessary to consider that those molecules which have been supplied from the gas nozzle and have not yet been given such thermal energy could collide with each other. Thus, if the equation (1), i.e., $d > L$ is satisfied, the above condition need not be taken into account.

When the reactant gas is supplied at the same rate for the wafer and for the thin film made of the material having the lower sticking coefficient compared with that of the wafer, the period of the time required until the nucleus formation begins to appear on the thin film made of the material having the lower sticking coefficient must be longer than that for the wafer. This is because the total amount of the molecules required to be supplied until the time they reach the surface molecule concentration when the nucleus formation begins to appear must be larger than that for the wafer. It may be appreciated that the only condition under which the nucleus formation begins to appear on the thin film made of the material having the lower sticking coefficient is the surface molecule concentration. According to the present invention, therefore, the epitaxial growth will have finished below the critical supply total amount at which the nucleus formation should begin. Thus, the selective epitaxial growth for the wafer can occur both at the lower temperature of the wafer and at the higher growth rate.

In general terms, the surface molecular concentration refers to the number of collections of one or two atoms (or critical nucleus) that may be present as the precursors per unit area of the wafer.

BRIEF DESCRIPTION OF THE DRAWINGS

Those and other objects, merits, and features of the present invention may be understood from the detailed description of several preferred embodiments that follows with reference to the accompanying drawings in which:

FIG. 5 is a graph illustrating the temperature of substrate dependence of the critical supply total amount of the reactant gas. As far as supply total amount of the reactant gas did not exceed the critical amount, the SEG (selective epitaxial growth) was carried out;

DETAILS OF THE PREFERRED EMBODIMENTS

The present invention will be described in more detail with reference to a particular preferred embodiment in which a disilane ($Si_2H_6$) gas is used as the reactant gas during the silicon gas source epitaxial growth process that may occur according to the present invention.

Figure 1:
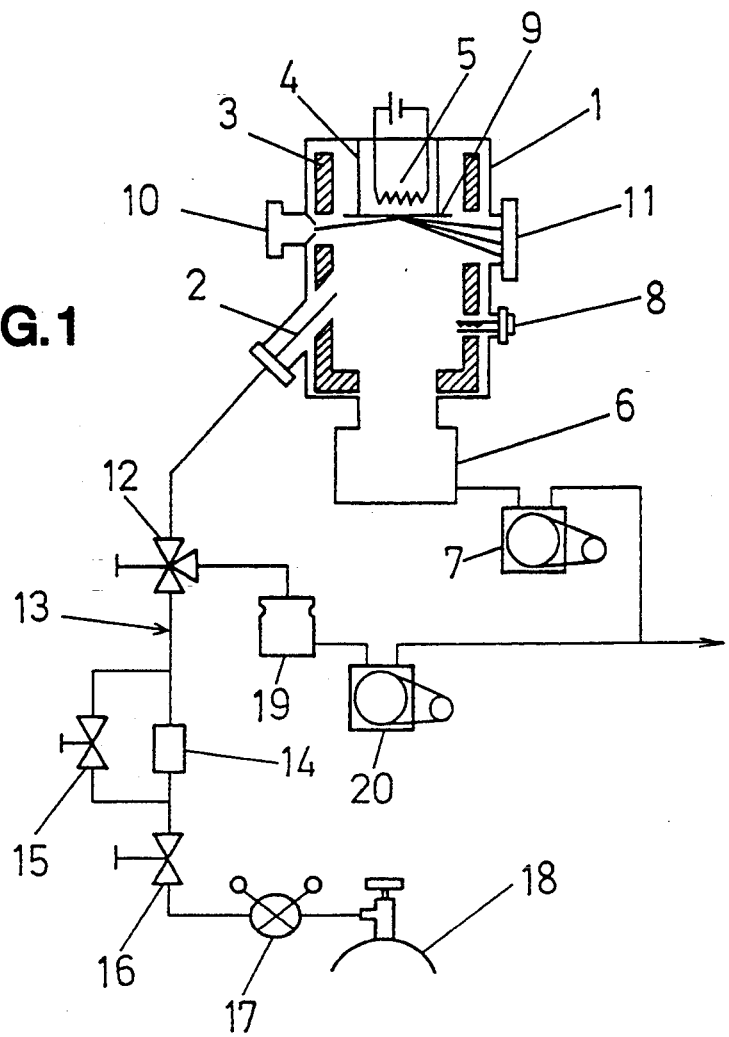
FIG. 1 is a schematic diagram showing the arrangement of the apparatus for use in the embodiment of the present invention.

Referring to FIG. 1, there is shown a schematic diagram that illustrates the arrangement of the typical apparatus that may be used in the embodiment to be described below. It should be understood that the sizes, shapes, and relative positions of the component parts shown in FIG. 1 are only given schematically so as to help appreciate the concept of the present invention. A vacuum chamber 1 has a gas nozzle 2 extending thereinto, and includes a liquid nitrogen-cooled shroud 3 arranged along the inner wall thereof. There is a wafer holder 4 above the space delimited by the liquid nitrogen-cooled shroud 3. A heater 5 is disposed to face opposite-the wafer holder 4.

The vacuum chamber 1 may be evacuated by a turbo molecular pump 6 (which has a pumping speed of 1,000 liters/sec.) and an auxiliary oil-sealed rotary pump 7 which are disposed at the bottom of the vacuum chamber. A nude ion gauge 8 is mounted on the lateral side of the vacuum chamber 1 and is sensitive to any change in the pressure inside the vacuum chamber 1 for measuring the pressures therein. A RHEED device (Reflection High Energy Electron Diffraction) includes an electron gun 10 and a screen 11, and may be used to observe the surface conditions of the wafer 9 on its holder 4.

A gas inlet conduit system 13 is connected to the gas nozzle 2 by way of a three-way valve 12. The gas inlet conduit system 13 includes a mass flow controller 14, valves 15, 16, and a regulator 17 which are interconnected as shown. The regulator 17 connects to a gas supply container 18 which in this case contains a disilane gas. The three-way valve 12 is also connected to an exhaust system including a turbo molecular pump 19 and an auxiliary oil-sealed rotary pump 20. This exhaust system removes any remaining gas from the conduits in the gas inlet system.

In the arrangement described above, the vacuum chamber 1 can reach a pressure of less than $1.0 \times 10^{-9}$ Torr. In the embodiment being described, the diffused portion of the reactant gas molecules from the gas nozzle 2 can all be absorbed by the liquid nitrogen-cooled shroud 3, and the non-diffused portion of the molecules can all be flying directly from the gas nozzle 2 across the space and can reach the wafer. The total amount of the molecules that have reached the wafer can be determined in terms of the total amount of the reactant gas that bas been supplied. The liquid nitrogen cooled shroud 3 may be replaced by a water-cooled shroud (such as the one disclosed in Japanese patent application No. 2-25302). In this case, the total amount of the molecules that have reached the wafer may also be determined in terms of the total amount of the supplied reactant gas, although some of the diffused molecules that have been absorbed by the water-cooled shroud may have reached the wafer.

The flow rate of the $Si_2H_6$ gas being supplied may be controlled by the mass flow controller 14 in the gas inlet system 13, and then may be supplied through the gas nozzle 2 into the vacuum chamber 1, traveling across the space toward the wafer 9. The gas flow may be switched at the three-way valve 12. When the gas is not delivered onto the wafer, the gas flow is then switched to connect to the exhaust turbo molecular pump 19 which delivers it out.

In the following discussion, it is supposed that $Si_2H_6$ gas is supplied into the vacuum chamber 1, and the pressure of the $Si_2H_6$ gas within the vacuum chamber 1 is less than $1.5 \times 10^{-3}$ Torr. Then, an attempt is made to determine whether the condition as specified by the equation (1), i.e., $d > L$ can be satisfied in this case. The distance between the wafer 9 and the liquid nitrogen-cooled shroud 3 is given as 40 mm (L=40 mm).

Then, the mean free path "d" (m) for the molecules may be found from the following equation:

$$d = 3.11 \times 10^{-24} \times \frac{T}{P \cdot D^2} \qquad (2)$$

where T is the temperature of the gas (K), P is the pressure (Pa), and D is the diameter of a molecule (m).

Figure 2:
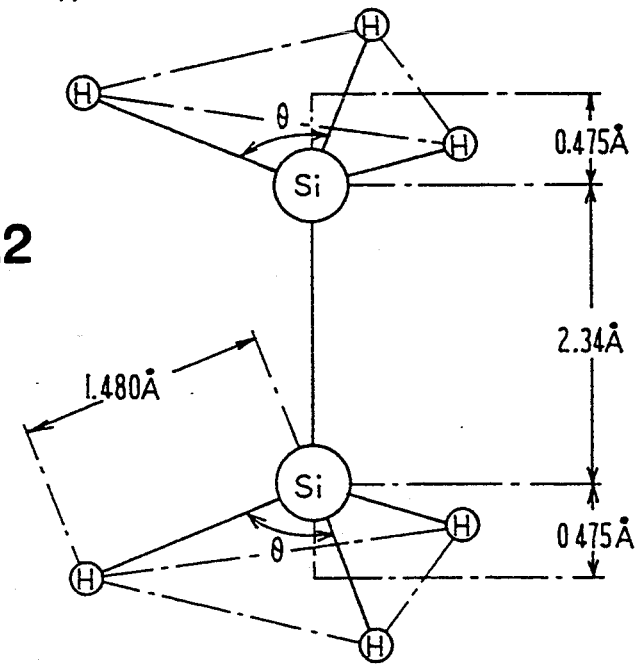
FIG. 2 shows the molecule structure model for $Si_2H_6$ gas.

Then, the above equation (2) may be used to find the mean free path for the $Si_2H_6$ gas molecules. The molecule structure model shown in FIG. 2 may be used when the diameter D of a given molecule in the $Si_2H_6$ gas is found. In this model, it is assumed that the distance between Si atoms is 2.34 Å, and the distance between Si atom and H atom is 1.480 Å. The triangular pyramid formed by Si atom and three H atoms has an apex ($\theta$ as shown) of 110.2°. Therefore, the height of the triangular pyramid may be calculated, resulting in 0.475 Å.

The diameter D of a given molecule in the $Si_2H_6$ gas may be found by calculating (distance between Si atoms)+2 (height of the triangular pyramid), that is, D=3.29 Å or $3.29 \times 10^{-10}$ m.

When the term $T/P \cdot D^2$ is replaced by the value of $D = 3.29 \times 10^{-10}$ m, T=298K. (assuming the room temperature of 25° C.), and $P = 1.5 \times 10^{-3}$ Torr = 0.1995 Pa, respectively, the resulting mean free path for the $Si_2H_6$ gas molecules is as follows:

d = 42.9×10$^{-3}$ m = 42.9mm  L = 40 mm, therefore it may be seen from the above values that the equation (1), i.e., d>L is satisfied. Then, if the pressure inside the vacuum chamber 1 is less than $1.5×10^{-3}$ Torr, it means that the pressure range that would cause substantially no vapor phase reaction has been provided.

Usually, every molecule in the reactant gas has a size (diameter D) of several angstroms (Å), and the arrangement is such that the shortest distance between the wafer and the inner wall (vacuum side-exposed wall) of the vacuum chamber 1 is about several centimeters (cm). Thus, if the pressure inside the vacuum chamber 1 is established to be less than $1×10^{-3}$ Torr, the condition under which substantially no vapor phase reaction will occur can be achieved.

If the reactant gas contains a mixture of different gases, the mean free path for the molecules in each respective gas may be several centimeters or more, provided the total internal pressure is equal to $1×10^{-3}$ Torr or less.

The foregoing description considers the probabilities of the reactant gas molecules striking against the wafer, the inner wall, and colliding with each other. Macroscopically, however, if the heat conduction in the vapor phase is very small, heat cannot conduct uniformly throughout the vapor phase. This means that substantially no vapor phase reaction will occur.

In practice, the inventors of the present invention discovered no degradation in the selectivity that might possibly be caused by the vapor phase reaction, as described later, when the pressure of the $Si_2H_6$ gas being supplied was within the vacuum chamber 1 was about $1.5×10^{-2}$ Torr in the arrangement of the apparatus shown in FIG. 1.

This is presumably because the heat conduction of the $Si_2H_6$ reactant gas molecules was too small to thermally decompose them under the pressure of $1.5×10^{-2}$ Torr. Specifically, this may be explained by the fact that even if the probability may be increased to some degree that the molecules might collide with those molecules which have been given the thermal energy, substantially no vapor phase reaction would occur unless the heat is evenly distributed through the total reactant gas molecules in the vapor phase.

It is very important in permitting the selective epitaxial growth against the wafer that the vacuum chamber 1 should be maintained under the pressure range that would cause substantially no vapor phase reaction.

When the selective epitaxial growth occurs between Si and $SiO_2$ by using $Si_2H_6$ gas as source, the part of the reactant gas that has been pre-cracked before reaching the wafer provides virtually no selective epitaxial growth.

This may be explained by the following reasons:
(a) When solid Si is deposited in vacuum evaporation, the Si atom provides no selective epitaxial growth as if no selective epitaxial growth occurs on the wafer; and
(b) When the inner wall (vacuum side-exposed wall) of the vacuum chamber is at high temperatures, the epitaxial film which is selectively grown is thin.

For example, this is reported by Recannelli et al. (Appln. Phys. Lett. 58 (19), 13 May 1991, P. 2096–P. 2098, "Low-temperature selective epitaxy by ultrahigh-vacuum chemical vapor deposition from $SiH_4$ and $GeH_4/H_2$"). The assumable cause for this is the reduction in the selectivity that may have been caused by the reactant gas that was decomposed somewhat when exposed to the high-temperature inner wall. More clearly, the reactant gas in its vapor phase causes the decomposing reaction, which in turn may generate an accompanying product in the vapor phase, and this product may be deposited onto the wafer. The decomposing reaction of $Si_2H_6$ may produce Si atoms or molecules such as $Si_nH_y$, with which selective epitaxial growth is interfered in the vapor phase, which may be deposited onto the wafer like as a vacuum evaporation.

Figure 3A:
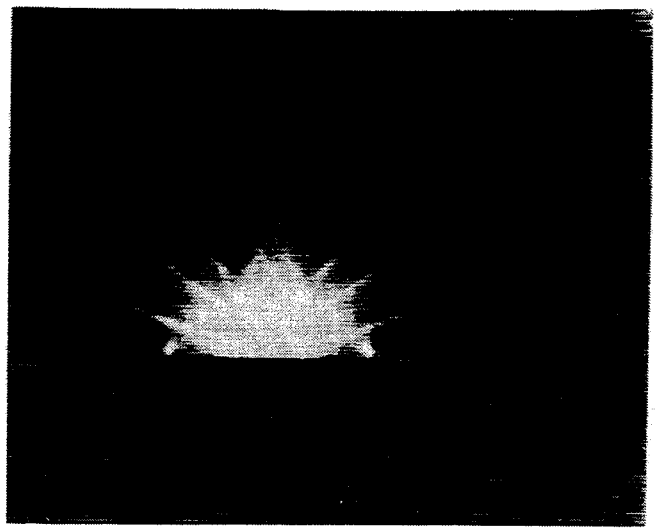
FIG. 3 presents two photographs (a) and (b) showing that the polycrystalline silicon nucleus formation does not appear on the oxide layer in the embodiment of the present invention, (a) showing the RHEED image and (b) showing the SEM image.
Figure 3B:
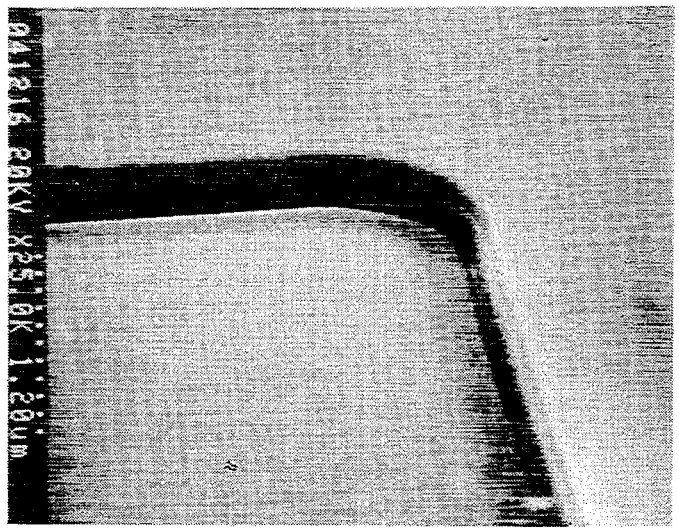
Figure 4A:
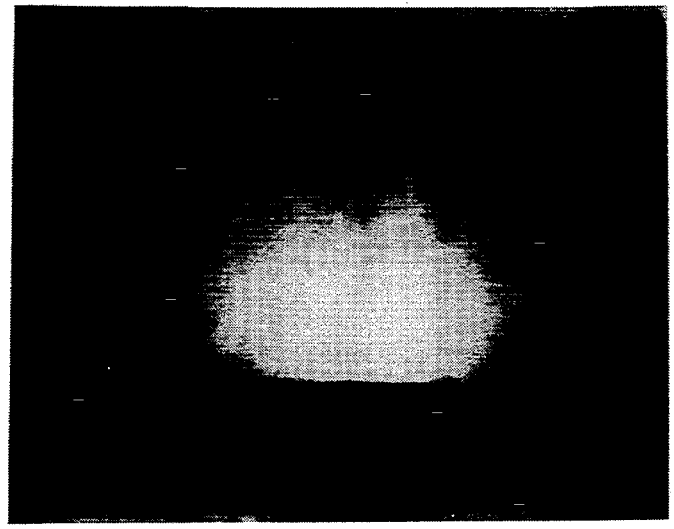
FIG. 4 presents two photographs (a) and (b) showing that the polycrystalline silicon nucleus formation appears on the oxide layer in the embodiment of the present invention, (a) showing the RHEED image and (b) showing the SEM image.
Figure 4B:
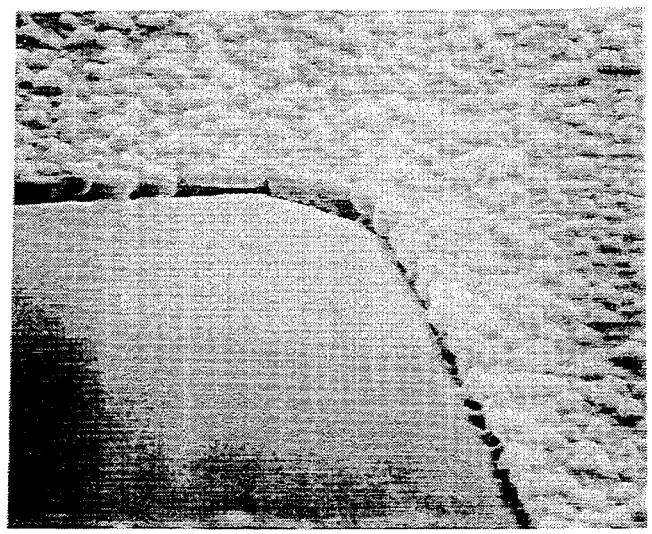

During the selective epitaxial growth process, a wafer 9 consists of a four-inch (001) wafer that contains $SiO_2$ film previously deposited by the CVD process and patterned. Prior to the setting, the wafer is rinsed using boiled etching solution ($H_2O:H_2O_2:NH_3OH = 20:6:1$), and is then set on its holder 4. Within the vacuum chamber 1, the wafer is thermally cleaned by way of being heated by the heater 5 up to 850° C. for ten (10) minutes, thereby removing any oxide layer that may have been produced naturally. Then, the selective epitaxial growth occurs onto the wafer by varying its temperature. Between $SiO_2$ film and Si film (wafer), it is obvious from the published articles on the selective epitaxial growth that $SiO_2$ is lower in sticking coefficient than Si. Whether the selective epitxy is present or not may be identified from the image that appears on the screen 11 on the RHEED device. If no polycrystalline silicon nucleus formation is observed on the oxide layer formed during the patterning process, the image from the RHEED device includes 2×1 +halos as shown in FIG. 3 (a), and the image from the SEM (scanning electron microscope) shows the surface condition of the wafer 9 as shown in FIG. 3 (b). If any polycrystalline silicon nucleus formation is present on the oxide layer, the image from the RHEED device includes 2×1 +rings as shown in FIG. 4 (a), and the SEM image shows-the surface condition of the wafer 9 as shown in FIG. 4 (b). To prevent any degradation of RHEED filament by the reactant gas (disilane) which is provided inside the chamber 1, observation of RHEED is carried out periodically. And similarly the filament of the ion gage 8 keeps being switched off to prevent its degradation. After the selective epitaxial growth is completed, the growth rate may be calculated and detemined by measuring the step height of thickness of the expitaxial film located around the center of the wafer, after removing any oxide layer formed during the patterning process by using the hydrofluoric acid (HF) solution.

The RHEED images may be observed at regular time intervals, and the time that it will take until the selective epitaxial growth collapses may be measured by looking at the varying images. As a result, it can be observed that the polycrystalline silicon nucleus formation appears on the oxide layer after an incubation period, and when the wafer is at the temperature of 600° C., the product of the incubation period and reactant gas flow rate, that is, the amount of the reactant gas being supplied during the incubation period remains constant regardless of its flow rate. From this, it can be found that the total amount of the gas that is be supplied until the polycrystalline silicon nucleus formation begins appear, that is, the critical amount gas being supplied at the moment that the polycrystalline silicon nucleus formation appears remains constant regardless of the supplied gas flow rate.

Referring to FIG. 5, the curves show the dependence upon the wafer temperature of the critical gas supply total amount at which the polycrystalline silicon formation appears, causing the selective epitaxial growth to collapse. It may be see, from the curves in FIG. 5 that for the wafer temperatures of below 650° C., the critical gas supply total amount may vary, depending solely upon the temperature of the wafer, rather than the reactant gas flow rate, and may be decreased as the temperature of the wafer is rising. It may also be clear from FIG. 5 that for the temperature of the wafer of above 750° C., the critical gas supply total amount may vary, depending upon both the wafer temperature and the gas flow rate, and may increase with the rising wafer temperature but may decrease with the increasing flow rate.

The face that the critical reactant gas supply total amount exists in the low temperature range (below 650° C.) implies that the polycrystalline silicon nucleus formation mechanism on the surface of $SiO_2$ is the same as the mechanism for the 3-dimensional island epitaxy according to the conventional MBE (Molecular Beam Epitaxy) method in which the nucleus formation begins when the molecular density on the surface of the oxide layer exceeds certain molecular density.

The above may be appreciated by modeling the selective epitaxial growth mechanism, as follows:

First, it is supposed that the polycrystalline silicon film on the oxide layer ($SiO_2$) and the epitaxial silicon film on the silicon (wafer) do not interact with each other. More specifically, it may be supposed that the deposition of the polycrystalline silicon film on $SiO_2$ is grown through the polycrystalline silicon formation mechanism at the time when the total wafer surface contains the oxide layer, and the silicon film on the silicon is grown through the epitaxial growth mechanism, the difference between the two growths providing the selective epitaxial growth.

Figure 6:
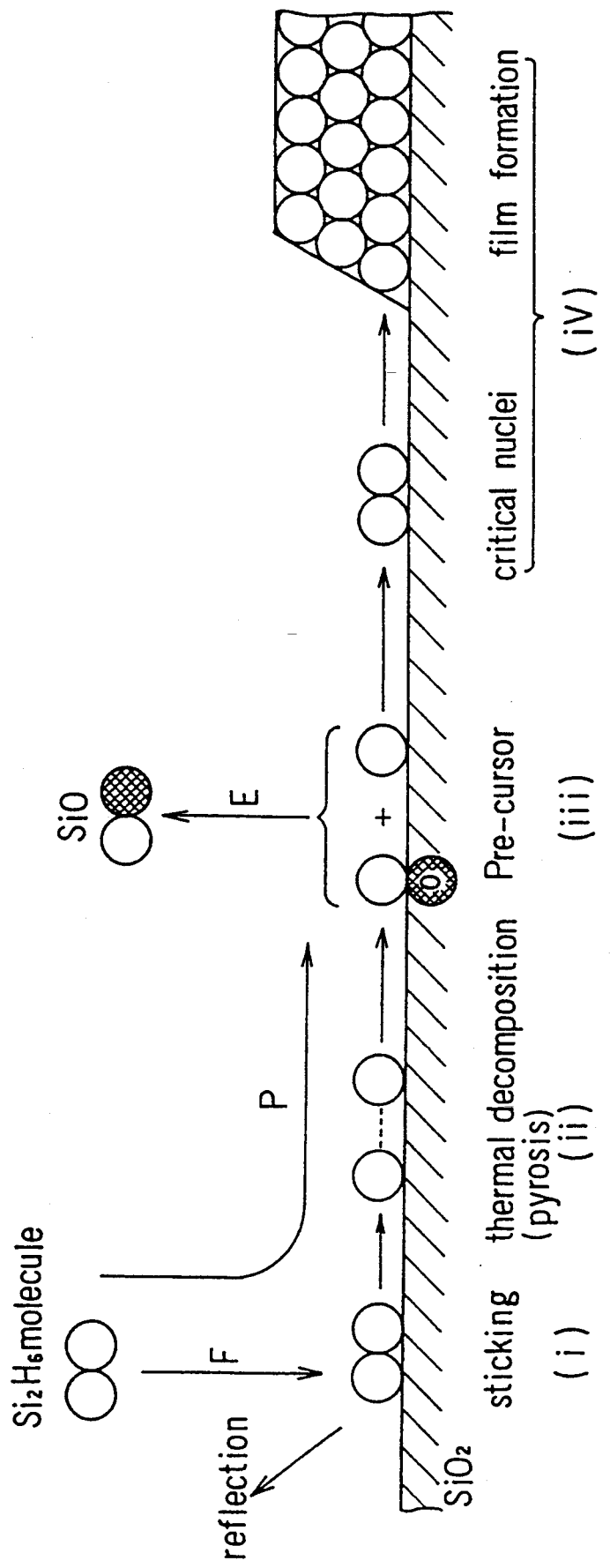
FIG. 6 is a schematic modeling diagram that illustrates the process during which a polycrystalline silicon is grown on the oxide layer.

The nucleus formation and growth of the polycrystalline silicon film on the oxide layer go through the steps as shown in FIG. 6. Specifically, (i) $Si_2H_6$ molecules impinging onto the oxide layer;
(ii) most part of the $Si_2H_6$ molecules are reflected back into the space, and some molecules settle down on the oxide layer, and are thermally decomposed;
(iii) The nucleus pre-cursors generated by the thermal decomposition remain on the oxide layer, increasing gradually;
(iV) When the quantity of the pre-cursors exceeds its critical level silicon at which the polycrystalline silicon film nucleus formation begins, a polycrystalline silicon film is generated on the oxide layer, and is grown theron. At this time, the selective epitaxial growth will have collapsed.

The process through which $Si_2H_6$ molecules are thermally decomposed and Si is thus formed practically may involve complex steps. It is conceivable, however, that finally when the quantity of pre-cursors (Si atom or Si bonded with several H atoms) exceeds a certain quantity (several atoms), a polycrystalline silicon may be formed.

Going through the above steps (i) through (iV), the Si epitaxial growth will proceed on Si on the patterned substrate, independently of the reaction that occurs on the oxide layer. This difference will appear as the selective epitaxial growth.

This may be explained by expressing it in terms of an equation, as follows:

The equation includes several parameters which are defined as:

Wafer temperature: constant

Decomposing efficiency of $Si_2H_6$ on $SiO_2$ (assuming the molecules reflected back are not decomposed): P $Si_2H_6$ flux rate: F (number/time)

Quantity of pre-cursors formed on $SiO_2$ per unit time: n (number)

It assumes that the pre-cursors are Si atoms meaning particles as final form which the polycrystalline silicon is composed. The quantity of pre-cursors is increasing as long as $Si_2H_6$ is supplied, but it does not decrease. This may be demonstrated from the fact that the critical supply total amount will not vary even when the reactant gas is suplied at intermittent intervals, in some practice experimental situations where the supply of the reactant gas is stopped to permit the RHEED images to be observed.

The critical quantity of precursors formed until the polycrystalline silicon film deposition begins:

Qc (number)

The critical quantity of pre-cursors formed until the polycrystalline silicon film deposition begins so that it can actually be observed:

qc (number)

The quantity of molecules evaporated as SiO per unit time:

E (number/time)

When the quantity "n" of pre-cursors formed on $SiO_2$ per unit time increases, the quantity E of molecules evaporated as SiO increases in proportion to "n". When "n" exceeds a certain value, "E" is limited by reaction limitation. That is, the rate of "E" is limited by reaction rate and remains constant, as compared with the increasing rate of "n".

Now, the quantity "n" of pre-cursors to be formed on $SiO_2$ per unit time may be found as follows:

$$n = 2F \times P \tag{3}$$

This may be understood from the following reaction equation:

(4)

However, it is supposed that Si in the above reaction equation is not Si atom forming Si, but Si atom forming as a pre-cursor (stage iii in FIG. 6).

The critical quantity "qc" of pre-cursors actually to be observed may be expressed as follows:

$qc$ = (quantity "$n$" of pre-cursors to be formed on $SiO_2$ per unit time) × (time "$t$" required to reach the critical quantity) (5)

Then, if SiO is not evaporated (low temperature range), the time "t" required to reach the critical quantity may be expressed as follows, since the pre-cursors (Si atoms) formed on $SiO_2$ will not decrease:

t = (critical quantity "Qc" of the pre-cursors formed until the polycrystalline silicon films begins to be deposited)/(quantity "n" of pre-cursors to be formed per unit time)

Symbolically, $$t = Qc/n \tag{7}$$

Therefore, from the equation (5), the critical quantity "qc" actually to be observed may be found, as follows:

$$qc = (Qc/n) \times n = Qc \tag{8}$$

It may be seen from the above equation (8) that the critical quantity "qc" does not depend on the flux rate F of $Si_2H_6$. With raising the temperature of the wafer, the migration length of the pre-cursors formed on $SiO_2$ (distance over which molecules can move around) increases and the discomposing rate (decomposing efficiency) of $Si_2H_6$ increases, therefore more pre-cursors are formed. Consequently, the probability of those pre-cursors meeting other decomposed molecules becomes greater. As a result, the probability of the polycrystalline silicon being formed become greter so that the critical quantity "Qc" of pre-cursors may be decreasing with the rising wafer temperature.

The next consideration is the case where $SiO_2$ is evaporated (high temperature range). In this case, the quantity "n" of pre-cursors to be formed per unit time will be equal to n-E (number), since SiO is evaporated according to the following reaction equation:

(9)

The time required to reach the critical quantity may be obtained from the equation (6), as follows:

$$t = Qc/(n-E) \tag{10}$$

Accordingly, the critical quantity "qc" of pre-cursors actually to be observed it:

$$\begin{aligned} qc &= \{Qc/(n-E)\} \times n \\ &= \{Qc/(2F \times P - E)\} \times 2F \times P \\ &= Qc / \left(1 - \frac{E}{2F \times P}\right) \end{aligned} \tag{11}$$

It may be seen from the above that the critical quantity depends upon the flow rate of the reactant gas being supplied. It may also be seen from the eqution (11) that:

i) the critical quantity "qc" to be observed will become more than the theoretical quantity value "Qc"; that is, it will increase as the temperature of the wafer is rising.

ii) when the $Si_2H_6$ flux rate F is smal and if $2F \times P$ equals the evaporated molecule amount E, the right side of the equation will become infinitely large; conversely, when F is great and if $2F \times P$ becomes greater than E, the right side of the equation will approximate to Qc; that is, the critical quantity "qc" depends upon the flow rate of the reactant gas.

Figure 7:
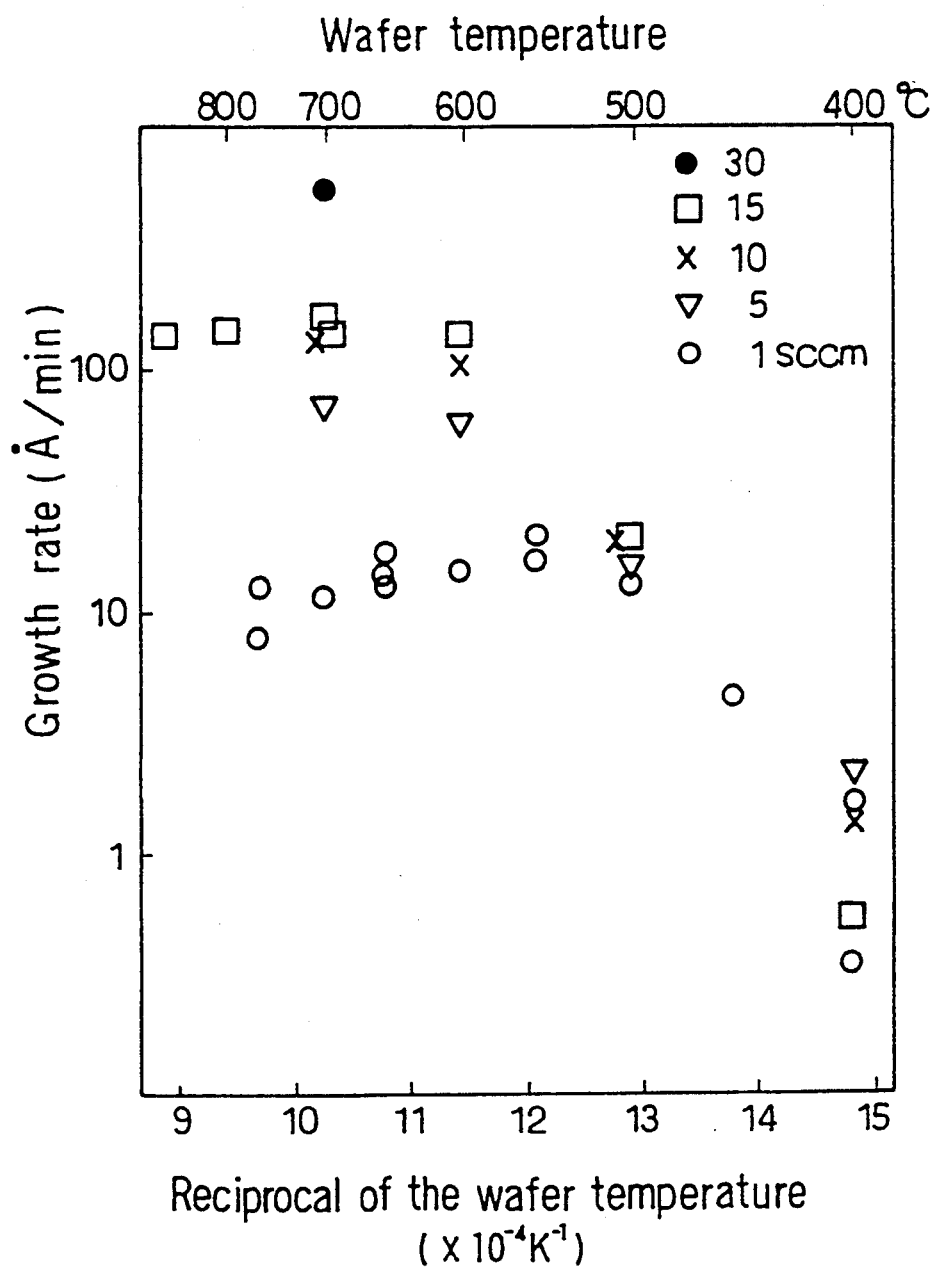
FIG. 7 is a graph illustrating the substrate (or wafer) temperature dependence of the epitaxial Si growth rate.

Referring to FIG. 7, there is shown how the epitaxial silicon film grown on the wafer exhibits its growth rate that depends on the temperature of the wafer. The growth rate may be determined by measuring a step height of the selectively grown film. The results show that the growth rate of between several Å/min and 100Å/min can be achieved even in the low temperature range (below 650° C.). It is also found that the selective epitaxial growth may be achieved in all temperature ranges by establishing the total amount of the reactant gas to be supplied below its critical supply total amount as shown in FIG. 5. The silicon highspeed selectively grown epitaxial film having a thickness of 1280 Å can be obtained by providing the wafer temperature of 700° C., the gas flow rate of 30 sccm and the growth rate of 640Å/min.

It should be understood that the condition under which no vapor phase reaction will occur can also be satisfied by using the water-cooled shroud instead of the liquid nitrogen-cooled shroud 3. This is described in the co-pending patent application (Japanese Patent Application No. 2-253002 U.S. application Ser. No. 07/756,573, filed Sep. 9, 1991.) filed by the inventors of the present invention. Using the water-cooled shroud improves the growth rate further, and provides thicker epitaxial films.

In the embodiment that has been described so far, the selective epitaxial growth is specifically carried out for the silicon wafer or substrate. Of course, the selective epiaxial growth can be applied to other substrates such as GaAs substrate. In either case, the type of the reactant gas to be used may depend upon the type of material for the material chosen. The type of the patterning material to be used may also depend upon the type of the reactant gas chosen. In this case, the patterning material that provides the low sticking coefficient relative to the reactant gas should be chosen.

Figure 8:
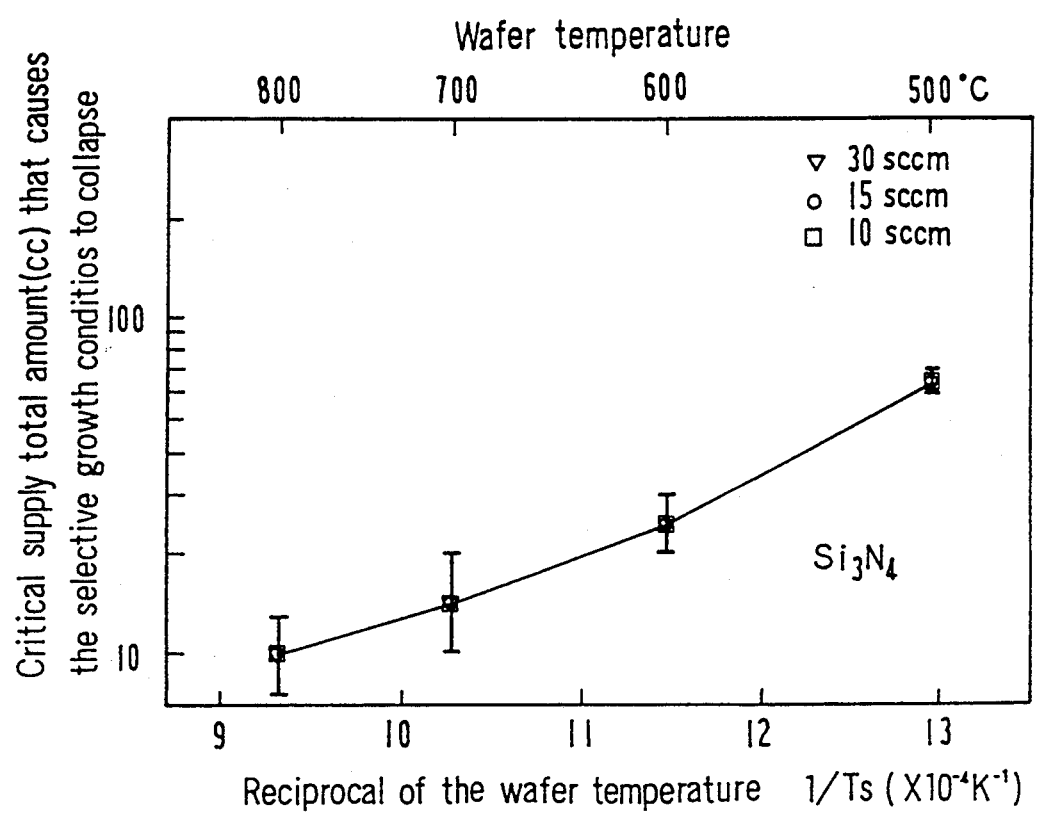
FIG. 8 is a graph illustrating the temperature of the substrate dependence of the critical supply total amount of the reactant gas. As far as the supply total amount of the reactant gas did not exceed the critical amount, the SEG on the Si substrate that has previously been patterned with the $Si_3N_4$ was carried out.

FIG. 8 shows the results obtained in the embodiment where the selective epitaxial growth has occurred on the Si wafer that is patterned with the $Si_3N_4$. In this embodiment, the $Si_2H_6$ reactant gas is used as for the preceding embodiment, and the Si epitaxial growth occurs on the Si wafer. In this case, Si isn't oxidized into Sio on $Si_3N_4$ layer, therefore, Si will never be evaporated. Thus, for the wafer temperatures of above 700° C., the critical supply total amount that causes the selective growth to collapse will not depend on the flow rate of the $Si_2H_6$ gas. Another important result may be seen from FIG. 8. That is the fact that as the temperature of the wafer is higher, the critical supply amount that causes the selective growth to collapse is decreasing accordingly. This is presumably because as the wafer temperature is higher, the decomposing rate (decomposing efficiency) of $Si_2H_6$ increasing and therefore more pre-cursors are formed; furthermore, at the higher temperature of the wafer, collections of atoms bonded together as pre-cursors (or critical nuclei) tend more easily to migrate on the substrate. When it is easy for those collections (critical nuclei) to migrate, the probability that they will meet other collections and bond with them may be increased. The film deposition will occur soon after those collections (critical nuclei) begin to join together. Thus, as the temperature of the wafer is rising, the film deposition can begin even if the surface molecular concentration is small. For this reason, if the wafer is at the higher temperature, the selective epitaxial growth can collapse with the small critical supply total amount. At the same temperature of the wafer, the critical supply total amount for $Si_2N_4$ is equal to about one-tenth that for $SiO_2$. This is presumably because the absorption site of $Si_2H_6$ molecules onto $Si_3N_4$ has the density ten times higher than for $SiO_2$.

Figure 9A:
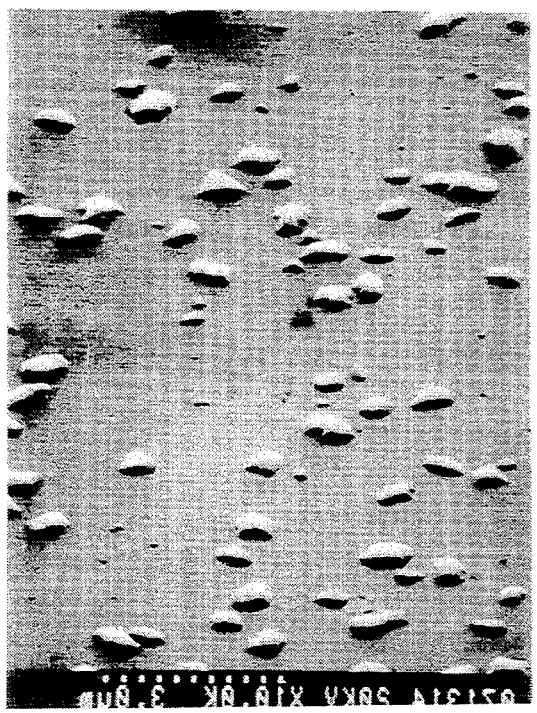
FIG. 9 presents two SEM photographs (a) and (b) showing the polycrystalline film deposited on the surfaces of the $SiO_2$ film and $Si_3N_4$ film, respectively, (a) being for $SiO_2$ and (b) being for $Si_3N_4$.
Figure 9B:
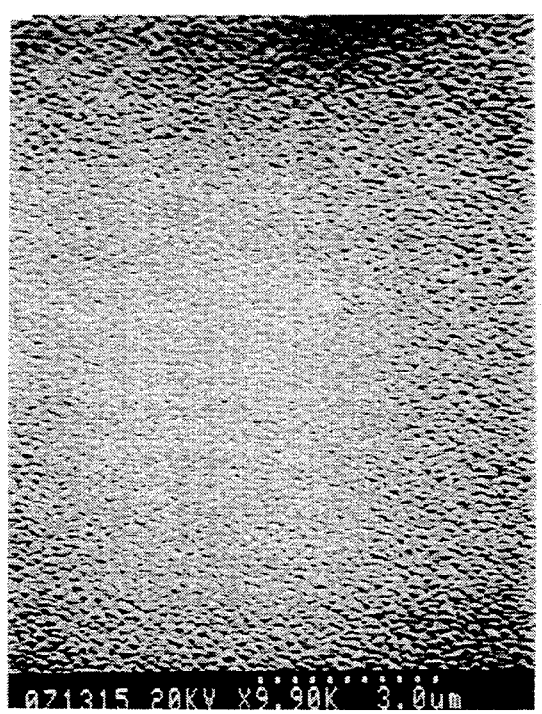

For the comparision of the polycrystalline silicon films actually deposited, two SEM photographs are shown in FIG. 9 (a) and (b). In FIG. 9, (a) shows the photograph for the SiO₂ film, and (b) shows the photograph for the SiO₂ film. For both photographs, the temperature of the wafer is at 580° C. As seen from FIG. 9 (a) and (b), the nucleus densities are clearly different.

Similarly, the selective epitaxial growth may occur when Si/Ge film is being deposited using $Si_2H_6$ and $GeH_4$ gases.

For the selective W-CVD, it is also found that there is the critical supply total amount. It is also found that exposing amorphous Si to $Si_2H_6$ causes a polycrystalline silicon film to be deposited. This reveals that the selective polycrystalline silicon film can be deposited in the similar manner between the oxide layer and amorphous Si. The selective polycrystalline silicon film may also be deposited between $Si_3N_4$ and $SiO_2$.

In the description that has been proceeded so far, the critical total amount for the reactant gas that can be supplied until the selective epitaxial growth collapses was determined, based upon the particular arrangement of the thin film deposition apparatus, such as the one shown in FIG. 1, which is configured to meet the particular physical requirements such as the distance between the gas nozzle 2 and wafer 9, the size of the vacuum chamber 1, the size of the liquid nitrogen-cooled shroud 3, etc. If those physical requirements for the apparatus are different from those for the apparatus described in the above embodiment, as a matter of course, the critical supply total amount that can be determined would have a different value.

The method of the present invention may be extended to apply to the total amount of the reactant gas molecules that can be impinging onto the surface of the wafer 9. Then, the method can be applied universally, independently of any particular physical hardware parameters for the apparatus.

The following description provides the method for controlling the selective epitaxial growth through the use of the total amount of the reactant gas molecules impinging Onto the surface of the wafer 9.

The amount of those reactant gas molecules which impinge onto the wafer surface, that is, impingement rate $\Gamma m$ (g/cm²m.sec), may be expressed as follows:

$$\Gamma m = 5.8 \times 10^{-2} \times P \times \left(\frac{M}{T}\right)^{\frac{1}{2}} \quad (12)$$

where P (Torr) is the pressure of the reactant gas, T (k) is the temperature of the reactant gas, and M is the molecular weight of the reactant gas molecules.

The impingement rate, $\Gamma m$ (g/cm².sec), found from the equation (12) may be expressed in terms of the number of the reactant gas molecules, $\Gamma n$ (number/cm².sec), as follows:

$$\Gamma n = 5.8 \times 10^{-2} \times P\left(\frac{M}{T}\right)^{\frac{1}{2}} \times \left(\frac{1}{M}\right) \times N_A \quad (13)$$

where $N_A$ is the Avogadro's number (6.02×10²³). Assuming that the time required until the selective epitaxial growth collapses after the critical nuclei on the SiO₂ layer have reached its critical amount is t cri (sec), the total amount of those reactant gas molecules which will be impinging onto the wafer surface before the nucleus formation begins, $\Gamma$ cri (nmber/cm²), may be found from the equation (13), as follows:

$$\Gamma\ cri = 5.8 \times 10^{-2} \times P \times \left(\frac{1}{TM}\right)^{\frac{1}{2}} \times N_A \times t\ cri \quad (14)$$

$$= \Gamma n \times t\ cri$$

This is the critical total impinging molecule amount.

Figure 10:
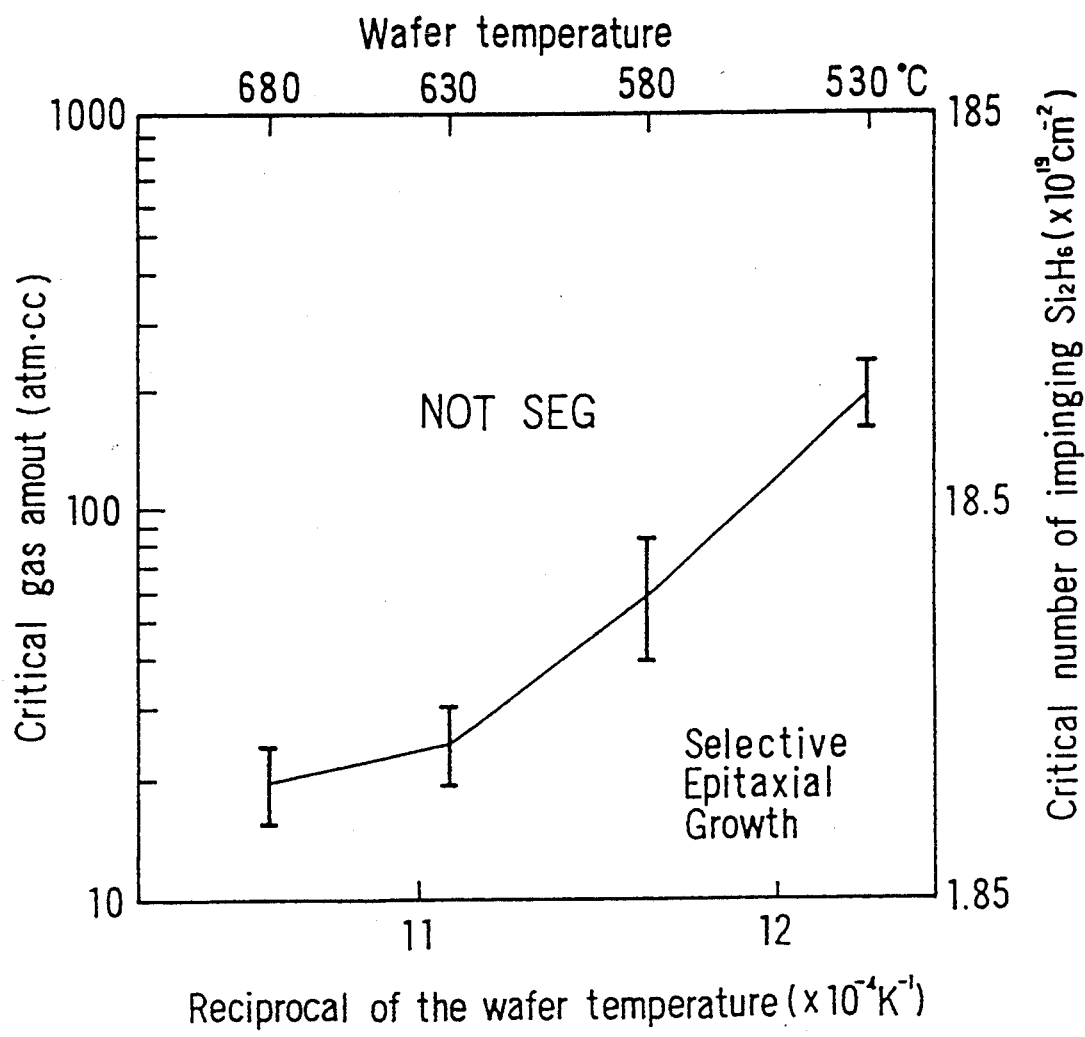
FIG. 10 is a graph illustrating the dependence of the critical supply total amount of the reactant gas that causes the selective growth to collapse according to another embodiment of the present invention.
Figure 11:
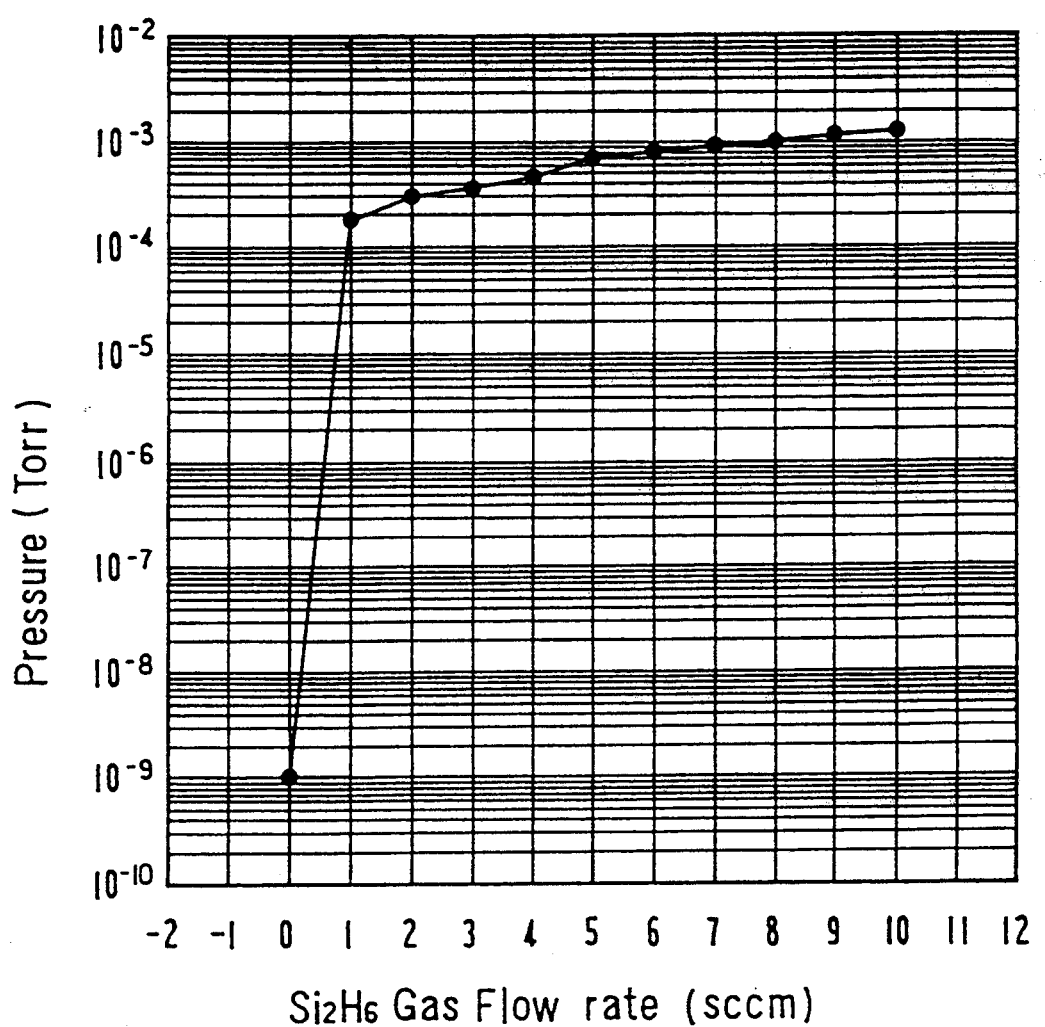
FIG. 11 is a graph illustrating the relationships between the $Si_2H_6$ gas flow rate and the pressure in a further embodiment of the present invention.

Referring to FIGS. 10 and 11, there is the data that results from the selective eqpitaxial growth that occurred when the water-cooled shroud was used, respectively. As seen from FIG. 10, the data is presented in graphical forms, illustrating the relationships between the temperature of the wafer and critical $Si_2H_6$ gas supply total amount. As seen from FIG. 11, the data is also presented in graphical forms, illustrating the relationship between the $Si_2H_6$ gas flow rate and the pressure inside the vacuum chamber 1.

Now, find the critical total molecule amount, $\Gamma$ cri by applying the above data to the equation (14). For the temperature of the wafer $T_s$=680° C., the critical supply total amount, was about 20 cc. When $Si_2H_6$ gas was supplied into the vacuum chamber at the rate (v) of 10 sccm, the pressure inside the vacuum chamber was about $1.2\times10^{-3}$ Torr.

Then, the time t cri required until the selective epitaxial growth collapses may be expressed as follows:

$$t\ cri = Qc/v \quad (15)$$

where v is the flow rate of the reactant gas being supplied, i.e., t=20/10=2 min=120 sec The molecule weight of $Si_2H_6$ gas, M, is 62.22. Assuming the temperature T is 25° C.=298K, substitute this for T in equation (14):

$$\Gamma\ cri = 5.8 \times 10^{-2} \times 1.2 \times 10^{-2} \times \left(\frac{1}{298 \times 62.22}\right)^{\frac{1}{2}} \times$$

$$6.02 \times 10^{23} \times 120$$

$$= 3.70 \times 10^{19}\ (\text{number/cm}^2)$$

The critical total impinging molecule amount, $\Gamma$ cri, remains constant, regardless of the flow rate of the reactant gas being supplied. For example, assuming the flow rate of the reactant gas is 5 sccm, the pressure inside the vacuum chamber, is about $6\times10^{-4}$ Torr as seen from FIG. 11, and t cri is 240 sec, therefore the critical total impinging molecule amount $\Gamma$ cri is derived from the equation (14), as follows:

$$\Gamma\ cri = 5.8 \times 10^{-2} \times 6 \times 10^{-4} \times \left(\frac{1}{298 \times 62.22}\right)^{\frac{1}{2}} \times$$

$$6.02 \times 10^{23} \times 240$$

$$= 3.70 \times 10^{19}\ (\text{number/cm}^2)$$

The resulting value is the same.

Similarly, by varying the flow rate of the reactant gas between 1 sccm and 19 sccm, the critical total impinging molecule amount, $\Gamma$ cri, may vary between about $3.7\times10^{10}$ and about $6\times10^{19}$ (number/cm²). $\Gamma$ cri may have a certain value range presumably due to some flow rate control errors in the mass flow controller or pressure measuring errors.

The critical total impinging molecule amount, $\Gamma$ cri, that can be reached until the time when the selective epitaxial growth will collapse has its value completely independent of the physical requirements for the thin film deposition arrangement. For example, those physical requirements may include the shape of the gas nozzle orifice 2, the distance between the orifice and wafer, the temperature of the shroud, the geometrical configuration and physical size of the vacuum chamber, etc. The changes to any or all of those physical requirements will not affect the critical total impinging molecule amount, $\Gamma$ cri. It is also not affected by the flow rate of the reactant gas being supplied. The physical parameters that govern the critical total impinging molecule amount $\Gamma$ cri are the physical values of the pressure, temperature, and molecule amount of the reactant gas, and, in addition, the material and temperature of the substrate or wafer that determines the sticking coefficient.

Table 1 shows the wafer temperatures given in FIG. 10 and the corresponding critical total impinging molecule amounts $\Gamma$ cri based on the respective wafer temperatures.

TABLE I

| Wafer Temp. (°C.) | 680 | 630 | 580 | 530 |
|---|---|---|---|---|
| critical supply total amount (cc) | 20 | 23 | 48 | 200 |
| $\Gamma$ cri (No./cm$^2$) × 10$^{19}$ | 3.7 | 4.2 | 8.8 | 37 |

The values for the critical total impinging molecule amounts given in the above table are unique at the wafer temperatures of 680° C., 630° C., 580° C., and 530° C., respectively, when the reactant gas is Si$_2$H$_6$ gas. Therefore, the selective epitaxial growth will collapse at the time when those critical total impinging molecule amounts are satisfied, regardless of any changes in the other physical parameters.

This has a different significance from the critical supply total amount described earlier. For the critical supply total amount, it has an identical value under certain conditions. For example, the certain conditions may include the shape of the gas nozzle orifice, the distance between the wafer and gas nozzle orifice and their relative positions, the temperature of the shroud, and the physical dimensions of the vacuum chamber. Therefore, the critical supply total amount that is known for one apparatus may be different for another apparatus.

The following description is provided for the two different shrouds that have the respective different temperatures. One arrangement includes a liquid-nitrogen circulating shroud, and another arrangement includes a water circulating shroud. For the arrangement including the water circulating shroud, it is found that the critical supply total amount is equal to about one-tenth that for the arrangement including the liquid-nitrogen circulating shroud. The curves shown in FIG. 5 are for the liquid-nitrogen circulating shroud, and the curves shown in FIG. 10 are for the water circulating shroud. Upon striking against the surface of the water circulating shroud, the reactant gas molecules being supplied are diffused, the major part of which are impinging over onto the wafer. For the liquid-nitrogen circulating shroud the reactant gas molecules, which striking against the surface of the shroud, are absorbed by the shroud. Thus, more reactant gas must be supplied until it can reach its quantity level that causes the nucleus formation to begin, that is, until the cirtical supply total amount can be reached.

It may be appreciated that the critical supply total amount may vary, depending upon the different temperatures of the shrouds. There are other factors that may affect the critical supply total amount, but if the critical conditions that cause the selective epitaxial growth to collapse is considered in terms of the number of molecules that can be impinging onto the wafer, those other factors may be disregarded since they will not affect the state of the thin film deposition apparatus and its internal arrangement or construction. This means that if the critical total impinging molecule amount of a particular reactant gas being supplied onto a particular wafer can be determined for a particular apparatus, it is possible for another apparatus to control the selective epitaxial growth by means of the critical total impinging molecule amount.

It may be understood from the foregoing description that according to the method of the present invention the selective epitaxial growth can be finished before the nucleus formation caused by the reactant gas molecules onto the wafer including tile previously patterned material having the low sticking coefficient relative to the reactant gas molecules begins, so that the selective epitaxial growth can proceed reliably. It may also be appreciated that the method of the present invention can have applications where the semiconductor devices are fabricated and the very highly integrated circuit devices are manufactured, since it ensures that the high-speed growth rate can be achieved without raising the temperature of the wafer.

The prior art assumes that the selective epitaxial growth is only possible for the small gas flow rate or for the low wafer temperature (for example, Hirayama et al., Appln. Phys. Lett. 52 (26), 27 Jun. 1988, pp. 2242–2243). As long as this assumption is followed, the growth rate must be kept low in the system where the it depends upon the gas flow rate and the temperature of the wafer.

The method of the present invention is based on the discovery that the selective epitaxial growth depends upon the total amount of the gas to be supplied (the fact that there is the supply total amount that causes the selectivity to collapse), rather than the gas flow rate and/or the wafer temperature. According to the method, therefore, the growth must be finished until the critical supply total amount is reached. As long as the critical supply total amount is followed, it is possible to vary the gas flow rate and/or wafer temperature upon which the growth rate depends, and the growth rate can be increased as required by increasing the gas flow rate and/or wafer temperature. (For the selective epitaxial growth using Si$_2$H$_6$ gas, the hydrogen elimination reaction from the surface causes the growth rate to be limited, making it impossible to increase the growth rate any further.)

If the temperature of the wager is constant, the condition under which the selective epitaxial growth collapse will be determined by the total amount of the gas that has been supplied, but not how the gas has been supplied. For example, the critical supply total amount that causes the selective growth to collapse for the wafer temperature of 600° C. is about 20 cc, which may be determined form FIG. 8. Assuming the reactant gas flow rate of 30 sccm, if this flow rate continues for 40 seconds, the selective growth will collapse. Similarly, for the flow rate of 15 sccm, if it continues for 80 seconds, and for the flow rate of 10 sccm, if it continues for 120 seconds, the selective growth will collapse. For the flow rate of 10 sccm, if it continues for every ten seconds at twelve intervals of ten seconds each, the selective growth will also collapse. When the gas is supplied at intervals, the condition under which the selective growth collapses will also be determined by the total amount of the gas that has been supplied in that way.

As it may be appreciated from the above description, the most important feature of the present invention is that the condition under which the selective epitaxial growth will collapse may be defined by the total amount of the reactant gas supplied. Accordingly, if the gas being supplied is stopped before it reaches its total amount, the selective growth can always occur. This means that the selective growth can be controlled by the total amount of the reactant gas that has been supplied. In this respect, the method of the present invention provides the concept that fundamentally differs from the concept of controlling the selective growth as the incubation time until the film formation begins (for example, Murata et al., Appln. Phys. Lett. 54 (11), 13 Mar. 1989, pp. 1007-1009, "Low-temperature silicon selective deposition and epitaxy on silicon using the thermal decomposition of silane under ultraclean environment"). The difference is the means of controlling the selective epitaxial growth, that is, for the present invention, the means is implemented by the "total amount of gas being supplied, whereas for Murata et al., it is implemented by the "incubation period".

Specifically, there are several possible ways of controlling the selective epitaxial growth. One way is to stop the supply of the reactant gas until the critical supply amount is reached, provided that the critical supply total amount is previously known from the film depositing conditions (such as the substance and temperature of a wafer, the kind of the reactant gas to be supplied, etc.), and then to permit the selective growth to occur. Another way is the one that may be used if the critical supply total amount cannot be determined in any way, wherein a film is previously deposited under the appropriate depositing conditions, and then the total reactant gas supply total amount at the time when the selective growth will collapse is previously determined; when a next film is deposited, the supply amount previously determined is used as the critical supply total amount; and this critical supply total amount is then used as the selective growth condition under which the selective growth occurs.

If the critical total impinging molecule amount, $\Gamma$ cri, is known in respect of the relationship between a particular wafer substance and a particular reactant gas, the critical supply total amount, Qc, for a particular apparatus may be determined from the equations (14) and (15), as follows:

$$\Gamma\ cri = 5.8 \times 10^{-2} \times P \times \left(\frac{1}{TM}\right)^{\frac{1}{2}} \times N_A \times \frac{Qc}{v} \quad (16)$$

Qc may be found from the equation (16). M and $N_A$ are constants, reapectively, and T is the room temperature. Therefore, the critical supply total amount, Qc, may be calculated by previously finding the pressure P for any value "v" of the flow rate on a particular apparatus. This means that there is no need of actually previously depositing a film in order to find the total reactant gas supply amount at the time when the selective growth will collapse.

Although the present invention has been described with reference to the several preferred embodiments, it should be understood that various changes and modifications may be made without departing from the spirit and scope of the invention.

What is claimed is:

1. A method of depositing a thin film on only a surface of at least one kind of material on a substrate the surface of which consists essentially of at least two kinds of materials so that deposition does not occur on the materials on which deposition is not desired, comprising the steps of:
   i) placing a substrate in position inside a vacuum chamber, evacuating the vacuum chamber until a pressure is attained, and introducing a reactant gas into the vacuum chamber after said pressure is attained;
   ii) setting said pressure inside the vacuum chamber filled with the reactant gas to a pressure range under which the mean free path "d" of the reactant gas molecules is longer than the shortest distance "L" between the substrate placed inside the vacuum chamber and the vacuum side-exposed wall of the vacuum chamber, or d>L; and
   iii) growing a thin film on only the surface of at least one kind of material on the substrate which surface consists essentially of at least two kinds of materials, and controlling the introduction of the reactant gas into the vacuum chamber so that the total supply amount of the reactant gas introduced into the vacuum chamber will be below an amount which is sufficient for nucleus formation on the surface of the other kinds of materials on which deposition is not desired.

2. A method of depositing a thin film on only a surface of at least one kind of material on a substrate the surface of which consists essentially of at least two kinds of materials so that deposition does not occur on materials on which deposition is not desired, comprising the steps of:
   i) placing a substrate in position inside a vacuum chamber, evacuating the vacuum chamber until a pressure is attained, and introducing a reactant gas into the vacuum chamber after said pressure is attained;
   ii) setting said pressure inside the vacuum chamber filled with the reactant gas to a pressure range under which the mean free path "d" of the reactant gas molecules is longer than the shortest distance "L" between the substrate placed inside the vacuum chamber and the vacuum side-exposed wall of the vacuum chamber, or d>L; and
   iii) growing a thin film on only the surface of at least one kind of material on the substrate which surface consists essentially of at least two kinds of materials, and controlling the introduction of the reactant gas into the vacuum chamber so that the total amount of the reactant gas molecules impinging onto the substrate will be below an amount which is sufficient for nucleus formation on the surface of the other kinds of materials on which deposition is not desired.

3. The method as defined in claim 1 or 2, wherein said thin film grown on only said surface of at least one kind of material is an epitaxial growth thin film.

4. The method as defined in claim 1 or 2, wherein said pressure inside the vacuum chamber filled with the reactant gas is set to less than $1.5 \times 10^{-2}$ Torr.

5. The method as defined in claim 1, wherein said total amount of the reactant gas introduced into the vacuum chamber is controlled by setting the temperature of the substrate.

6. The method as defined in claim 1 or 2, wherein the surface of the substrate consists of $SiO_2$ and $Si$, and the reactant gas is $Si_2H_6$ gas, and wherein an epitaxial Si film is grown on only the surface of Si.

7. The method as defined in claim 1 or 2, wherein the surface of the substrate consists of $Si_3N_4$ and $Si$, and the reactant gas is $Si_2H_6$ gas, and wherein an epitaxial Si film is grown on only the surface Si.

8. The method as defined in claim 1 or 2, wherein said at least two kinds of materials consisting the surface of the substrate have respectively different sticking coefficients relative to the reactant gas introduced.

9. The method as defined in claim 2, wherein the total amount of the reactant gas molecules impinging onto the substrate, $\Gamma$ cri, is found from the following equation:

$$\Gamma\, cri = 5.8 \times 10^{-2} \times \frac{PN_A\, t\, cri}{\sqrt{TM}}\ (number/cm^2)$$

where, T is the temperature of the reactant gas, M is the molecular weight for the reactant gas molecules, $N_A$ is Avogadro's umber, P is the pressure of the reactant gas inside said vacuum chamber, and t cri is the quotient of the total amount of the reactant gas supplied, Qc, at the time when the thin film was generated on the surface consisting of the said other kinds of materials, divided by the flow rate "v" of the reactant gas for the pressure of P, or $$t\, cri = \frac{Qc}{v}.$$

10. The method as defined in claim 2, wherein the total amount of the reactant gas molecules impinging onto the wafer is controlled by setting the temperature of the substrate.

11. The method as defined in claim 2, wherein the surface of the substrate consists of $SiO_2$ and $Si$, and the reactant gas is $Si_2H_6$, and wherein the conditions under which the relationships between the temperature of the substrate and the critical total molecule amount exist are defined as follows:

| Wafer temperature (°C.) | 680 | 620 | 580 | 530 |
|---|---|---|---|---|
| Crit. tot, mol. amt ($\times 10^{19}/cm^2$) | 3.7 | 4.2 | 8.8 | 37 |

12. The method as defined in claim 2, wherein the flow rate "v" of the reactant gas and the pressure "P" inside the vacuum chamber at the time when the reactant gas is being supplied for one apparatus are determined, and the critical supply total amount, Qc, is then calculated using the values determined above according to the equation given below, and wherein the critical supply total amount obtained above is used as the threshold value at which the introduction of the reactant gas into the vacuum chamber should be stopped:

$$\Gamma\, cri = 5.8 \times 10^{-2} \times P \times \left(\frac{1}{TM}\right)^{\frac{1}{2}} \times N_A \times \frac{Qc}{v}$$

13. A method of depositing a thin film on only a surface of at least one kind of material on a substrate the surface of which consists essentially of at least two kinds of materials so that deposition does not occur on materials on which deposition is not desired, comprising the steps of:
  i) placing a substrate in position inside a vacuum chamber, evacuating the vacuum chamber until a pressure is attained, and introducing a reactant gas into the vacuum chamber when said pressure is attained:
  ii) setting said pressure inside the vacuum chamber filled with the reactant gas to a pressure range under which the mean free path "d" of the reactant gas molecules is longer than the shortest distance "L" between the substrate placed inside the vacuum chamber and the vacuum side-exposed wall of the vacuum chamber, or $d > L$;
  iii) growing a thin film on only the surface of at least one kind of material of the substrate which surface consists essentially of at least two kinds of materials, measuring the total supply amount of the reactant gas introduced into the vacuum chamber at the time when said total supply amount of the reactant gas reaches an amount that is enough to generate the thin film on the other kinds of materials; and
  iv) when a thin film is formed subsequently on the other kinds of materials, controlling the introduction of the reactant gas into the vacuum chamber so that the total supply amount will be below that required for nucleus formation on the surface of said other kinds of materials.

* * * * *